(12) United States Patent
Lee

(10) Patent No.: US 10,318,200 B2
(45) Date of Patent: Jun. 11, 2019

(54) MEMORY SYSTEM CAPABLE OF RELIABLY PROCESSING DATA WITH REDUCED COMPLEXITY AND PERFORMANCE DETERIORATION, AND OPERATING METHOD THEREOF

(71) Applicant: SK hynix Inc., Gyeonggi-do (KR)

(72) Inventor: Jong-Min Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 53 days.

(21) Appl. No.: 15/175,860

(22) Filed: Jun. 7, 2016

(65) Prior Publication Data
US 2017/0177226 A1 Jun. 22, 2017

(30) Foreign Application Priority Data
Dec. 18, 2015 (KR) .................. 10-2015-0181863

(51) Int. Cl.
| | |
|---|---|
| *G06F 3/06* | (2006.01) |
| *G11C 29/00* | (2006.01) |
| *G06F 1/3287* | (2019.01) |
| *G11C 29/02* | (2006.01) |
| *G11C 29/12* | (2006.01) |
| *G11C 29/42* | (2006.01) |

(Continued)

(52) U.S. Cl.
CPC ............ *G06F 3/064* (2013.01); *G06F 1/3287* (2013.01); *G06F 3/0619* (2013.01); *G06F 3/0634* (2013.01); *G06F 3/0656* (2013.01); *G06F 3/0659* (2013.01); *G06F 3/0679* (2013.01); *G11C 29/028* (2013.01); *G11C 29/12* (2013.01); *G11C 29/42* (2013.01); *G11C 29/76* (2013.01); *G11C 5/148* (2013.01); *G11C 2029/0407* (2013.01)

(58) Field of Classification Search
CPC ...... G06F 3/064; G06F 3/0619; G06F 3/0656; G06F 3/0659; G06F 3/0679; G06F 3/0629; G06F 3/0634; G06F 1/3287; G06F 29/08; G11C 29/42; G11C 29/12; G11C 29/028; G11C 29/76; G11C 2029/0407; G11C 5/148
See application file for complete search history.

(56) References Cited

U.S. PATENT DOCUMENTS

| | | | | |
|---|---|---|---|---|
| 5,991,517 A | * | 11/1999 | Harari | .............. G06F 3/0601 |
| | | | | 711/E12.008 |
| 6,073,232 A | * | 6/2000 | Kroeker | .............. G06F 3/0607 |
| | | | | 713/1 |

(Continued)

FOREIGN PATENT DOCUMENTS

KR 1020100136729 12/2010

*Primary Examiner* — Michael Krofcheck
(74) *Attorney, Agent, or Firm* — IP&T Group LLP

(57) ABSTRACT

A memory system may include: a memory device including a plurality of pages each having a plurality of memory cells coupled to a plurality of word lines and suitable for storing data, and a plurality of memory blocks each having the pages; and a controller suitable for programming test data to a first memory block among the memory blocks before a first time point, and programming meta-data corresponding to the program of the test data to a second memory block among the memory blocks, in case where the memory system including the memory device is changed from a power-on state to a power-off state at the first time point.

14 Claims, 12 Drawing Sheets

(51) Int. Cl.
*G11C 5/14* (2006.01)
*G11C 29/04* (2006.01)

(56) References Cited

U.S. PATENT DOCUMENTS

| | | | | |
|---|---|---|---|---|
| 6,956,784 B1* | 10/2005 | Laing | ............ | G11C 17/16 |
| | | | | 365/154 |
| 8,661,301 B1* | 2/2014 | Yen | ............ | G11C 16/22 |
| | | | | 711/103 |
| 2004/0022086 A1* | 2/2004 | Nguyen | ............ | G11C 29/38 |
| | | | | 365/185.09 |
| 2004/0088630 A1* | 5/2004 | Arima | ............ | G06F 1/3203 |
| | | | | 714/744 |
| 2006/0069851 A1* | 3/2006 | Chung | ............ | G06F 11/1004 |
| | | | | 711/103 |
| 2011/0283065 A1* | 11/2011 | Kurashige | ............ | G06F 12/0866 |
| | | | | 711/118 |
| 2012/0150527 A1* | 6/2012 | Creedon | ............ | G06F 3/0607 |
| | | | | 703/24 |
| 2014/0075268 A1* | 3/2014 | Yen | ............ | G11C 16/22 |
| | | | | 714/773 |
| 2014/0149641 A1* | 5/2014 | Avila | ............ | G11C 11/412 |
| | | | | 711/103 |
| 2014/0226426 A1* | 8/2014 | Uvieghara | ............ | G11C 5/143 |
| | | | | 365/226 |
| 2015/0340099 A1* | 11/2015 | Kwak | ............ | G11C 16/34 |
| | | | | 711/103 |
| 2016/0188213 A1* | 6/2016 | Lin | ............ | G11C 16/3459 |
| | | | | 711/103 |

* cited by examiner

MEMORY SYSTEM CAPABLE OF RELIABLY PROCESSING DATA WITH REDUCED COMPLEXITY AND PERFORMANCE DETERIORATION, AND OPERATING METHOD THEREOF

CROSS-REFERENCE TO RELATED APPLICATIONS

The present application claims priority of Korean Patent Application No. 10-2015-0181863, filed on Dec. 18, 2015, which is incorporated herein by reference in its entirety.

BACKGROUND

1. Field

Exemplary embodiments of the present invention relate to a memory system and, more particularly, to a memory system which processes data to a memory device and an operating method thereof.

2. Description of the Related Art

The computer environment paradigm has shifted to ubiquitous computing systems that can be used anytime and anywhere. Due to this, the use of portable electronic devices, such as mobile phones, digital cameras, and notebook computers has rapidly increased. These portable electronic devices generally use a memory system having a semiconductor memory device (memory device) for storing data. A memory device may be used as a main memory device or an auxiliary data storage device of a portable electronic device.

Memory devices provide excellent stability, durability, high information access speed, and low power consumption, since they have no moving parts. Examples of memory devices having such advantages include universal serial bus (USB) memory devices, memory cards having various interfaces, and solid state drives (SSD).

SUMMARY

Various embodiments of the invention are directed to a memory system capable of reliably processing data with reduced complexity and performance deterioration. The memory system may further have improved efficiency in employing one or more memory devices included in the memory system. The invention is further directed to an operating method for the memory system.

In an embodiment, a memory system may include: a memory device suitable for storing data; and a controller suitable for programming test data to a first memory block of the memory device and programming meta-data corresponding to the program of the test data to a second memory block of the memory device before a first time point when the memory system is changed from a power-on state to a power-off state at the first time point.

The controller may generate the test data with a predetermined pattern, may store the generated test data in a first buffer, and may program the test data stored in the first buffer to the first memory block before the first time point. The controller may generate the meta-data according to the program of the test data, may store the generated meta-data in a second buffer, and may program the meta-data stored in the second buffer to the second memory block before the first time point.

When the memory system may be changed to the power-on state at a second time point after the first time point, the controller may read the meta-data programmed in the second memory block, and may load the read meta-data to the second buffer.

The controller may check map data of the test data through the meta-data loaded in the second buffer, may read the test data programmed in the first memory block through the map data, and may load the read test data to the first buffer.

The controller may check a first data distribution of the test data programmed before the first time point through the meta-data loaded in the second buffer, may check a second data distribution of the test data read out at the second time point through the read test data loaded in the first buffer.

The controller may check a voltage distribution of memory cells storing the test data programmed before the first time point and a voltage distribution of the memory cells storing the test data read out at the second time point as the first data distribution and the second data distribution of the test data, respectively.

The controller may check the number or locations of memory cells storing the test data programmed before the first time point and the number or locations of the memory cells storing the test data read out at the second time point as the first data distribution and the second data distribution, respectively.

The controller may check a data offset of the test data through a difference between the first data distribution and the second data distribution, may adjust a parameter of the memory system according to the data offset of the test data, and may perform a command operation to the memory system using the adjusted parameter.

The controller may program the test data to all pages included in the first memory block or a first page among all the pages.

The meta-data may include the number or locations of memory cells in which the test data are programmed, among a plurality of memory cells included in all the pages or the first page.

In an embodiment, an operating method of a memory system including a memory device, may include: confirming that the memory device is changed to a power-off state from a power-on state at a first time point; programming test data to a first memory block of the memory device before the first time point; and programming meta-data corresponding to the program of the test data to a second memory block of the memory device before the first time point.

The programming of the test data to the first memory block before the first time point may include: generating the test data with a predetermined pattern and storing the generated test data in a first buffer; and programming the test data stored in the first buffer to the first memory block. The programming of the meta-data to the second memory block before the first time point may include: generating the meta-data and storing the generated meta-data in a second buffer; and programming the meta-data stored in the second buffer to the second memory block.

The operating method may further include, when the memory system is changed to the power-on state at a second time point after the first time point, reading the meta-data programmed in the second memory block, and loading the read meta-data to the second buffer.

The operating method may further include: checking map data of the test data through the meta-data loaded in the second buffer; and reading the test data programmed in the first memory block through the map data, and loading the read test data to the first buffer.

The operating method may further include: checking a first data distribution of the test data programmed before the first time point through the meta-data loaded in the second buffer; and checking a second data distribution of the test data read out at the second time point through the read test data loaded in the first buffer.

The checking of the first data distribution and the second data distribution may include checking a voltage distribution of memory cells storing the test data programmed before the first time point and a voltage distribution of the memory cells storing the test data read out at the second time point as the first data distribution and the second data distribution of the test data, respectively.

The checking of the first data distribution and the second data distribution may include checking the number or locations of memory cells storing the test data programmed before the first time point and the number or locations of the memory cells storing the test data read out at the second time point as the first data distribution and the second data distribution, respectively.

The operating method may further include: checking a data offset of the test data through difference between the first data distribution and the second data distribution; adjusting a parameter of the memory system according to the data offset of the test data; and performing a command operation to the memory system using the adjusted parameter.

The programming of the test data to the first memory block may include programming the test data to all pages included in the first memory block or a first page among all the pages.

The meta-data may include the number or locations of memory cells in which the test data are programmed, among a plurality of memory cells included in all the pages or the first page.

DETAILED DESCRIPTION

Figure 1:
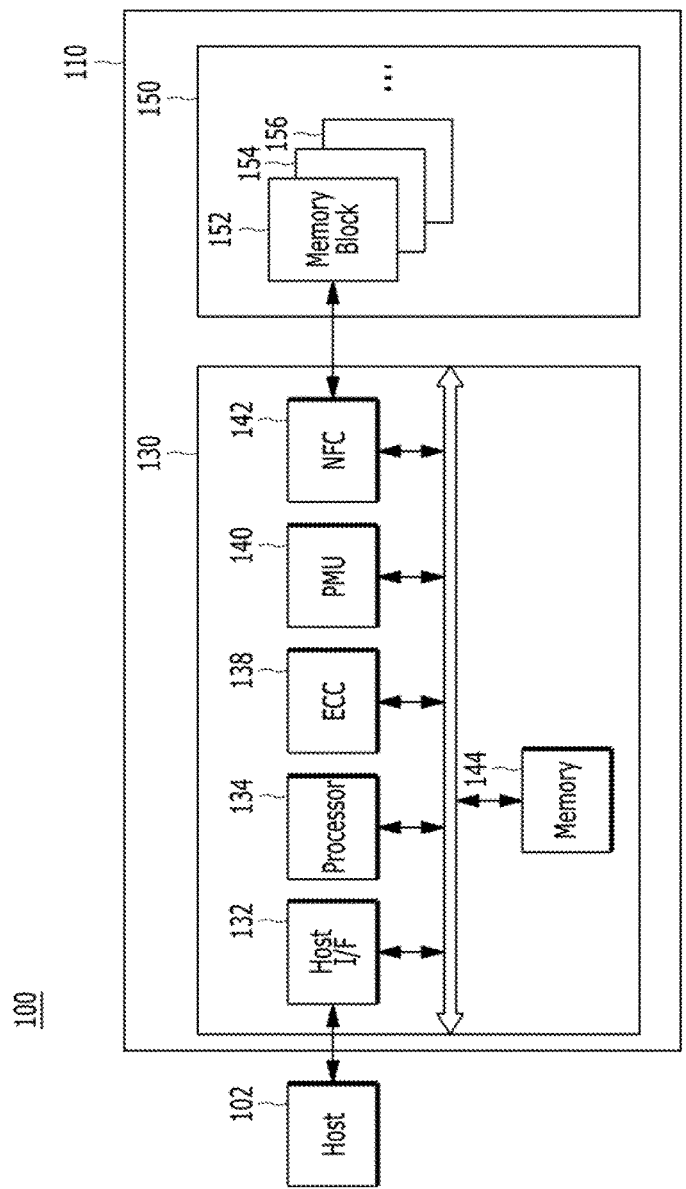
FIG. 1 is a diagram illustrating a data processing system including a memory system according to an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it can be directly on, connected to, or coupled to the other element, or one or more intervening elements may be present. In addition, it will also be understood that when an element is referred to as being "between" two elements, it can be the only element between the two elements, or one or more intervening elements may also be present.

As used herein, the singular forms "a" and "an" are intended to include the plural forms as well, unless the context clearly indicates otherwise.

It will be further understood that the terms "comprises", "comprising", "includes", and "including" when used in this specification, specify the presence of the stated elements but do not preclude the presence or addition of one or more other elements.

As used herein, the term "and/or" includes any and all combinations of one or more of the associated listed items.

The terminology used herein is for the purpose of describing particular embodiments only and is not intended to be limiting of the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known structures and/or processes have not been described in detail in order not to unnecessarily obscure the present disclosure.

Hereinafter, the various embodiments of the present disclosure will be described in details with reference to attached drawings.

FIG. 1 is a block diagram illustrating a data processing system including a memory system according to an embodiment.

Referring to FIG. 1, a data processing system 100 may include a host 102 and a memory system 110.

The host 102 may include, for example, a portable electronic device such as a mobile phone, an MP3 player and a laptop computer or an electronic device such as a desktop computer, a game player, a TV, a projector and the like.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices, such as, for example, a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory card 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit 140, a NAND flash controller 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
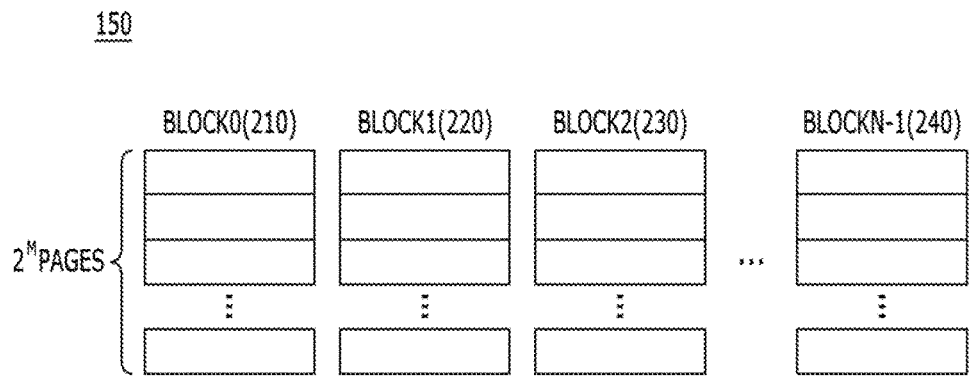
FIG. 2 is a diagram illustrating a memory device in the memory system of FIG. 1, according to an embodiment of the present invention.

FIG. 2 is a schematic diagram illustrating the memory device 150 of FIG. 1.

Referring to FIG. 2, the memory device 150 may include a plurality of memory blocks, for example, zeroth to (N−1)$^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
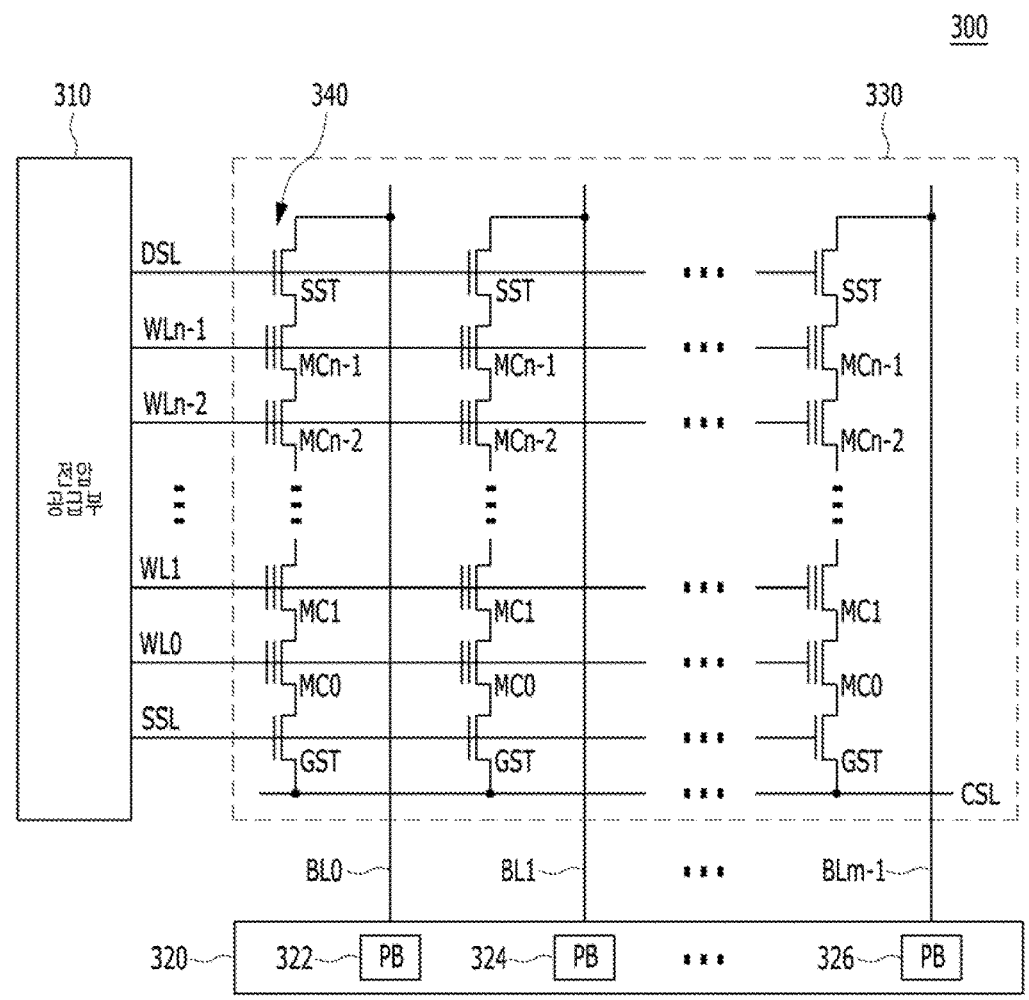
FIG. 3 is a circuit diagram illustrating a memory block in a memory device, according to an embodiment of the present invention.

FIG. 3 is a circuit diagram illustrating one of the plurality of memory blocks 152 to 156 of FIG. 1.

Referring to FIG. 3, the memory block 152 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by multi-level cells (MLC) each of which stores data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 in accordance with the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

FIGS. 4 to 11 are schematic diagrams illustrating the memory device 150 of FIG. 1.

Figure 4:
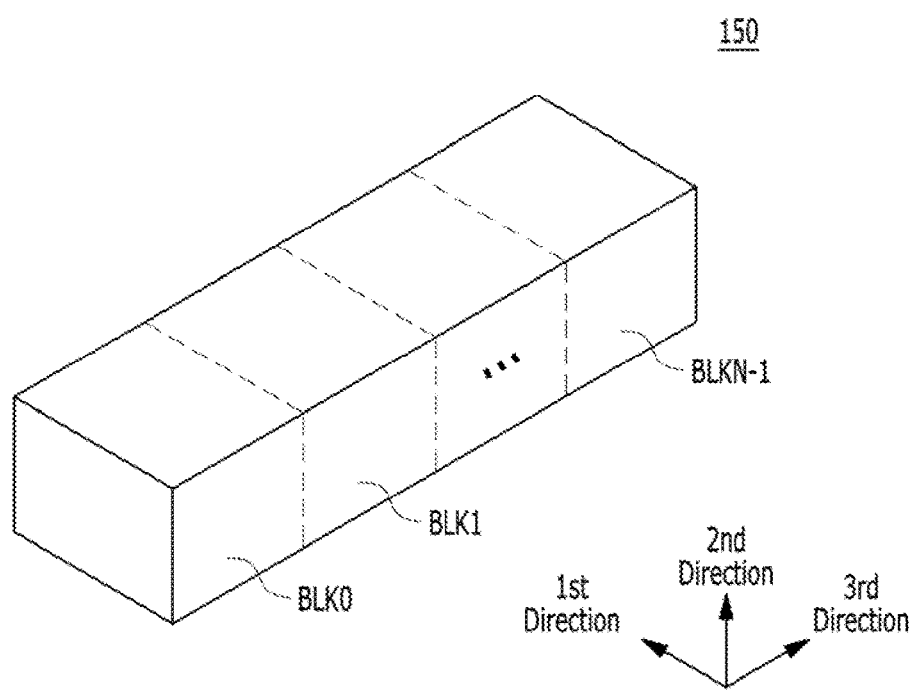
FIGS. 4 to 11 are diagrams schematically illustrating various aspects of the memory device of FIG. 2.

FIG. 4 is a block diagram illustrating an example of the plurality of memory blocks 152 to 156 of the memory device 150 of FIG. 1.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. The respective memory blocks BLK0 to BLKN−1 may include structures which extend in first to third directions, for example, an x-axis direction, a y-axis direction and a z-axis direction.

The respective memory blocks BLK0 to BLKN−1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. Namely, the respective memory blocks BLK0 to BLKN−1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
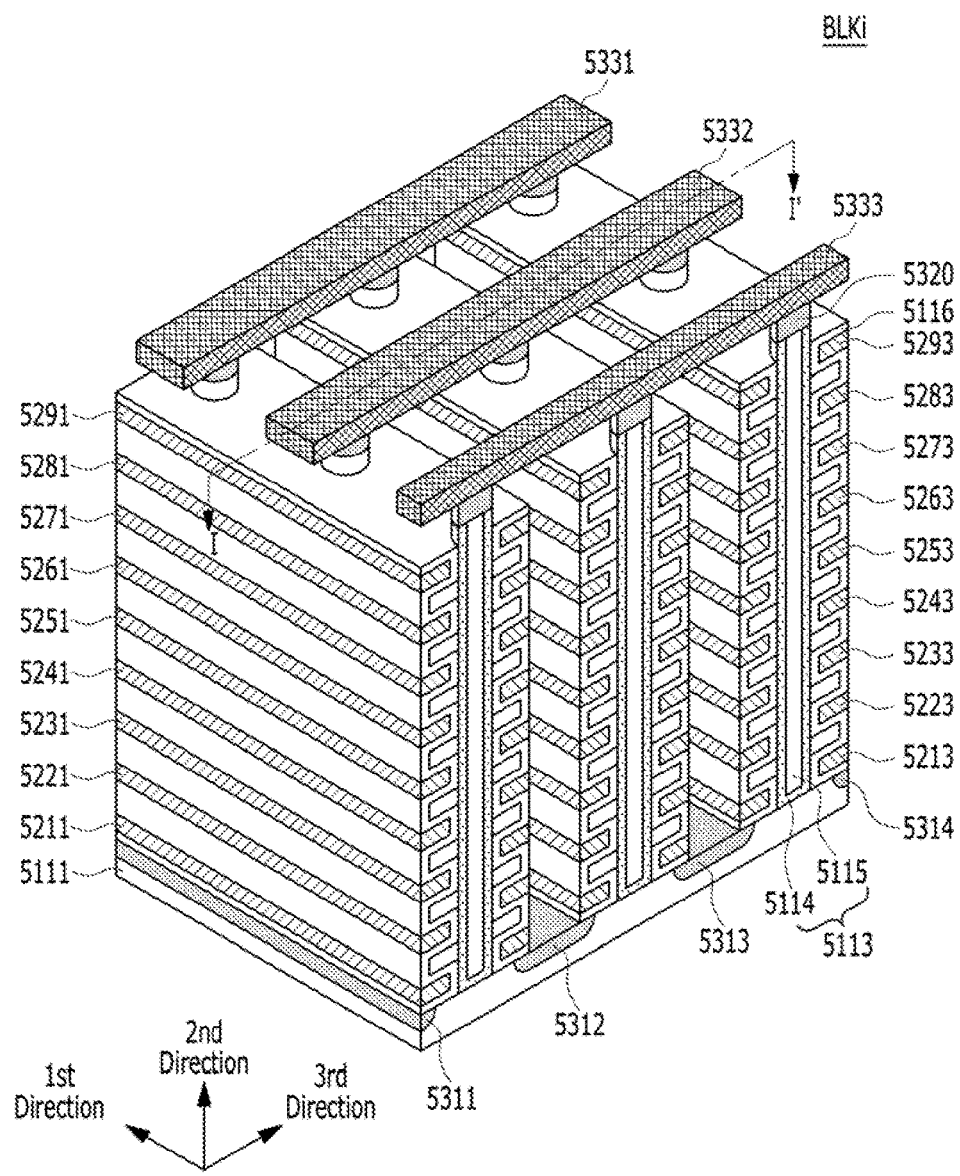
Figure 6:
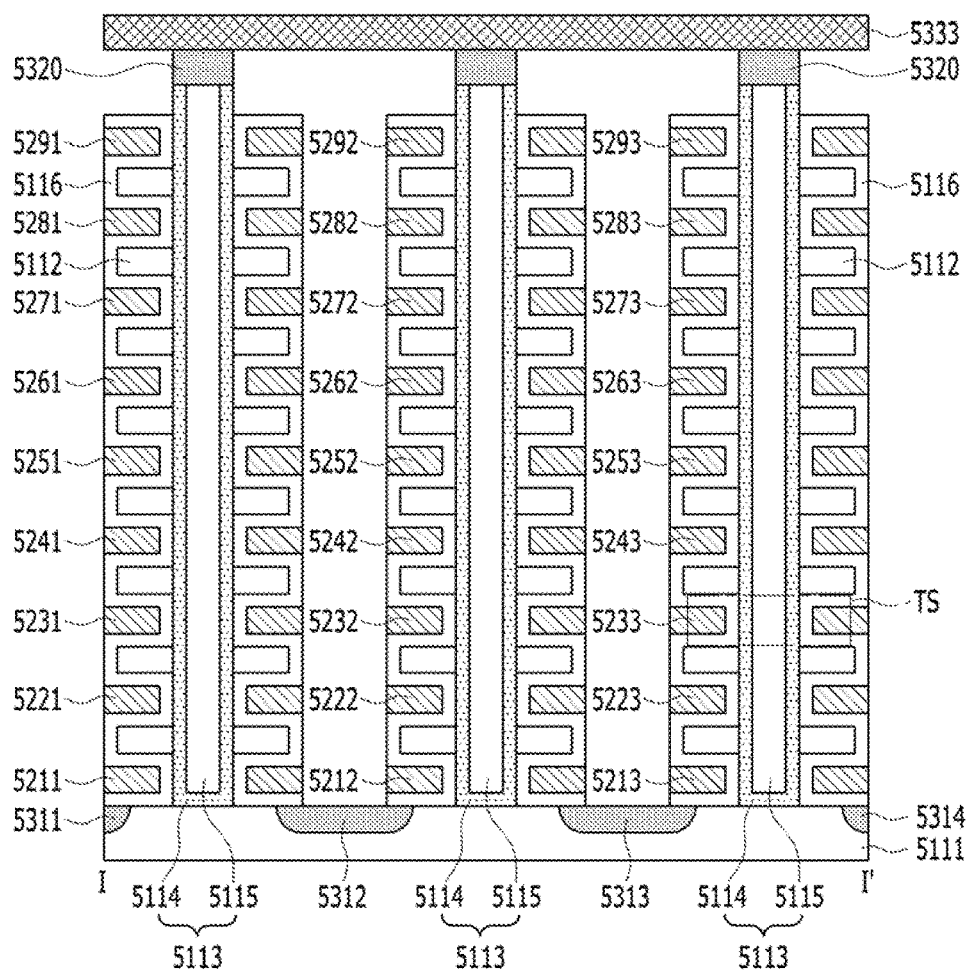

FIG. 5 is a perspective view of one BLKi of the plural memory blocks BLK0 to BLKN−1 of FIG. 4. FIG. 6 is a cross-sectional view taken along a line I-I' of the memory block BLKi of FIG. 5.

Referring to FIGS. 5 and 6, a memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. While it is assumed here that first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 which extend in the first direction may be provided between the dielectric materials 5112. The conductive material 5291 which extends in the first direction may be provided over the uppermost dielectric material 5112. The conductive materials 5211 to 5291 which extend in the first direction may be a metallic material. The conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 which extend in the third direction may be electrically coupled with through contact plugs. The conductive materials 5331 to 5333 which extend in the third direction may be a metallic material. The conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
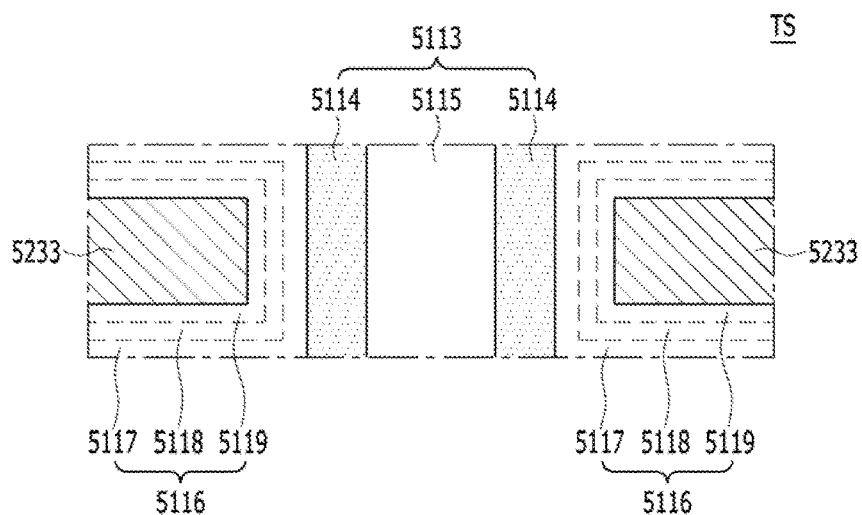

FIG. 7 is a cross-sectional view of the transistor structure TS of FIG. 6.

Referring to FIG. 7, in the transistor structure TS of FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, at least one source select line SSL and at least one ground select line GSL.

The conductive materials 5331 to 5333 which extend in the third direction may be electrically coupled to one end of the NAND strings NS. The conductive materials 5331 to 5333 which extend in the third direction may serve as bit lines BL. That is, in one memory block BLKi, the plurality of NAND strings NS may be electrically coupled to one-bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi may include a plurality of NAND strings NS which extend in a direction perpendicular to the substrate 5111, e.g., the second direction, and may serve as a NAND flash memory block, for example, of a charge capturing type memory, in which a plurality of NAND strings NS are electrically coupled to one-bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are electrically coupled to one-bit line BL, it is to be noted that the embodiment is not limited to having 3 NAND strings NS that are electrically coupled to one-bit line BL. In the memory block BLKi, m number of NAND strings NS may be electrically coupled to one-bit line BL, m being a positive integer. According to the number of NAND strings NS which are electrically coupled to one-bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
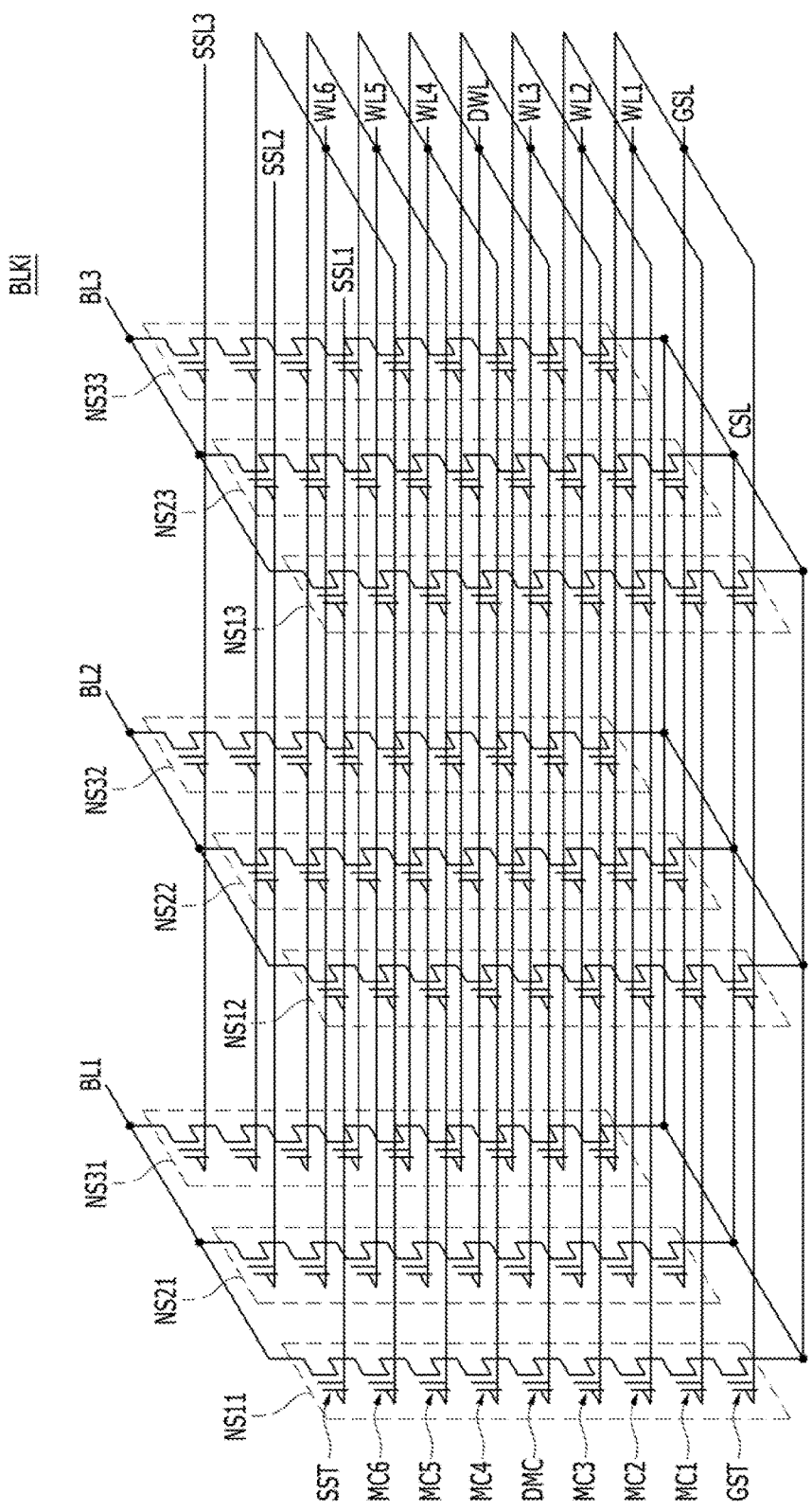

FIG. 8 is an equivalent circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by units of rows and columns and NAND strings NS which are electrically coupled to one-bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 5211 to 5291, 5212 to 5292 and 5213 to 5293 which extend in the first direction may be provided. The conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer, the first to fourth doping regions 5311 to 5314 may be electrically coupled.

Namely, as of FIG. 8, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

Hereinbelow, detailed descriptions will be made with reference to FIGS. 9 to 11, which show the memory device in the memory system in accordance with an embodiment implemented with a three-dimensional (3D) nonvolatile memory device different from the first structure.

Figure 9:
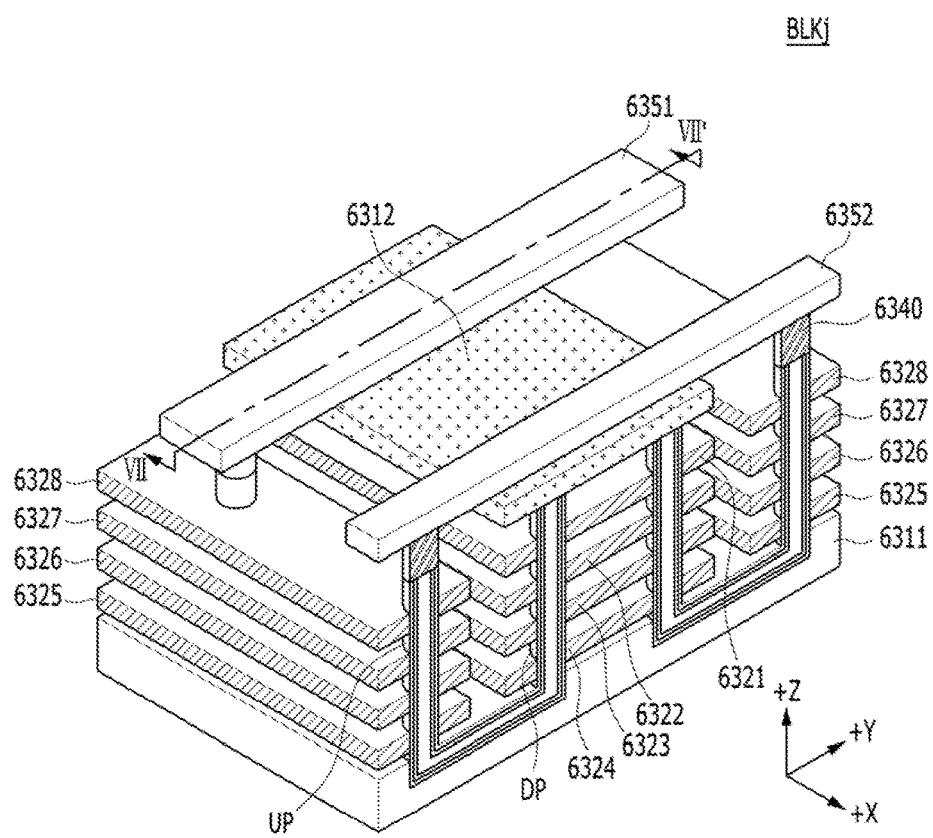

FIG. 9 is a perspective view schematically illustrating the memory device implemented with the three-dimensional (3D) nonvolatile memory device, which is different from the first structure described above with reference to FIGS. 5 to 8, and showing a memory block BLKj of the plurality of memory blocks of FIG. 4. FIG. 10 is a cross-sectional view illustrating the memory block BLKj taken along the line VII-VII' of FIG. 9.

Figure 10:
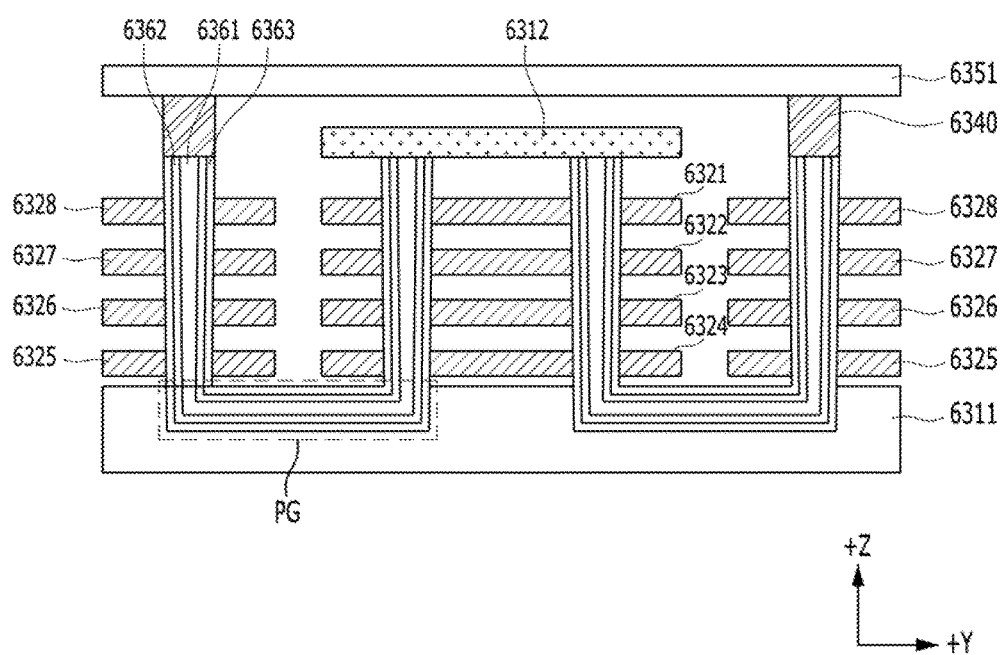

Referring to FIGS. 9 and 10, the memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment for the sake of convenience that the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also, a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
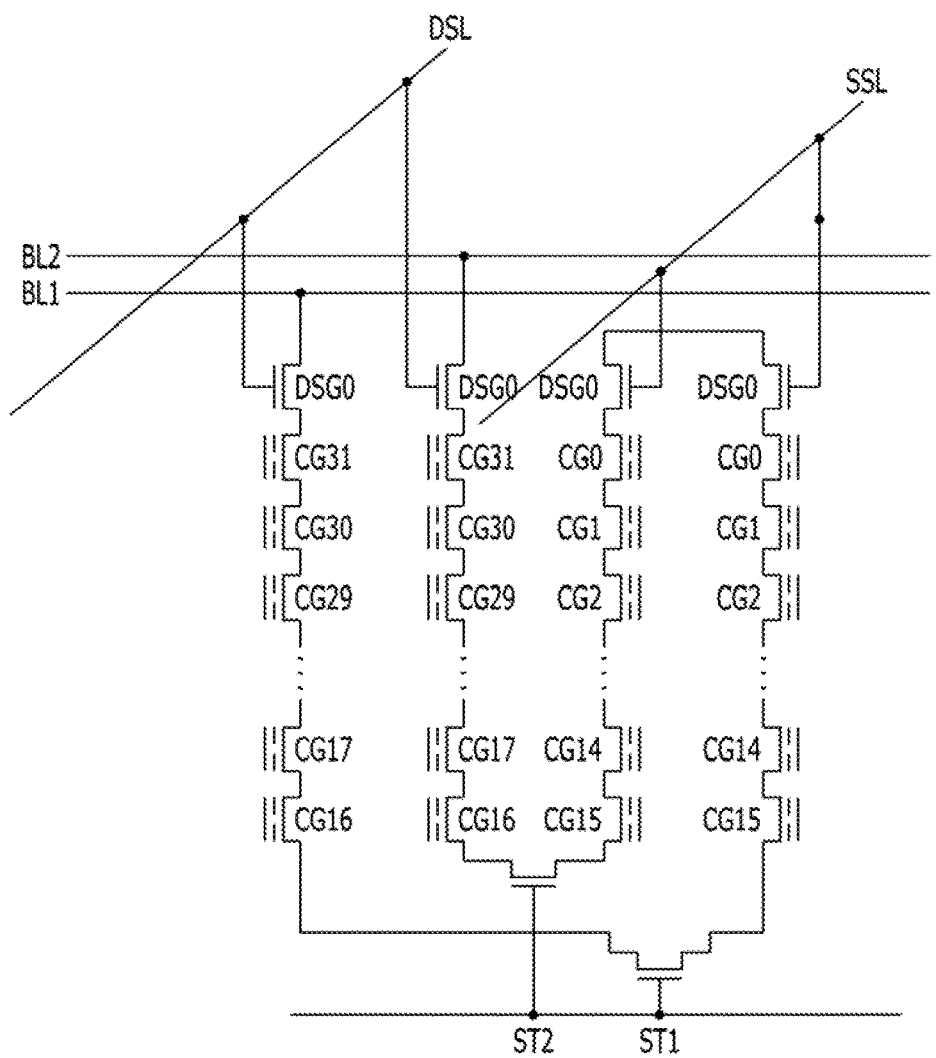

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure are shown.

Referring to FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

Namely, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Hereafter, a data processing operation to a memory device in a memory system in accordance with an embodiment of the present invention, or particularly a command operation corresponding to a command received from the host 102, for example, a command data processing operation to the memory device 150 will be described in more detail with reference to FIGS. 12 to 14.

Figure 12:
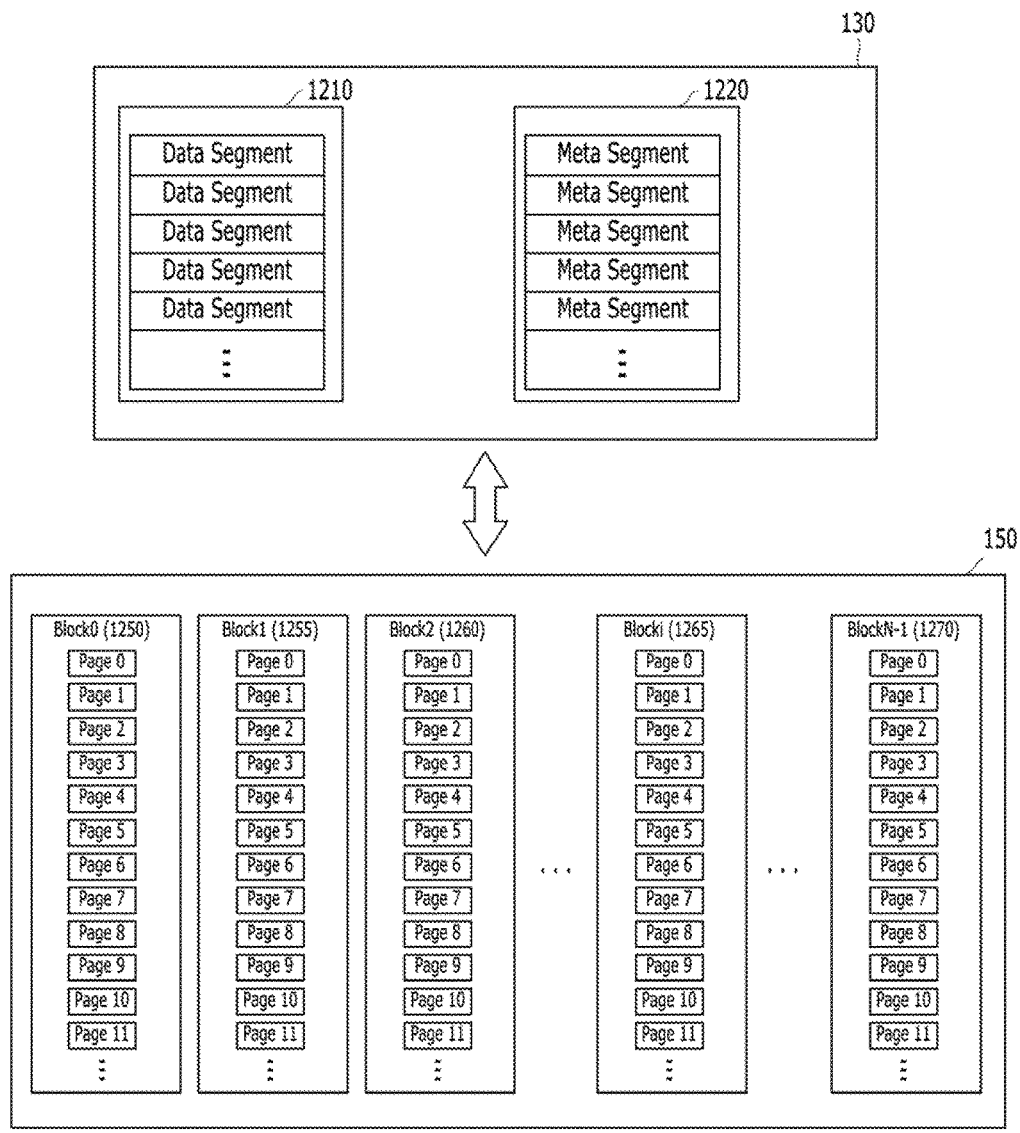
FIGS. 12 and 13 are diagrams schematically illustrating an operation method of the memory system of FIG. 1, according to an embodiment of the present invention.
Figure 13:
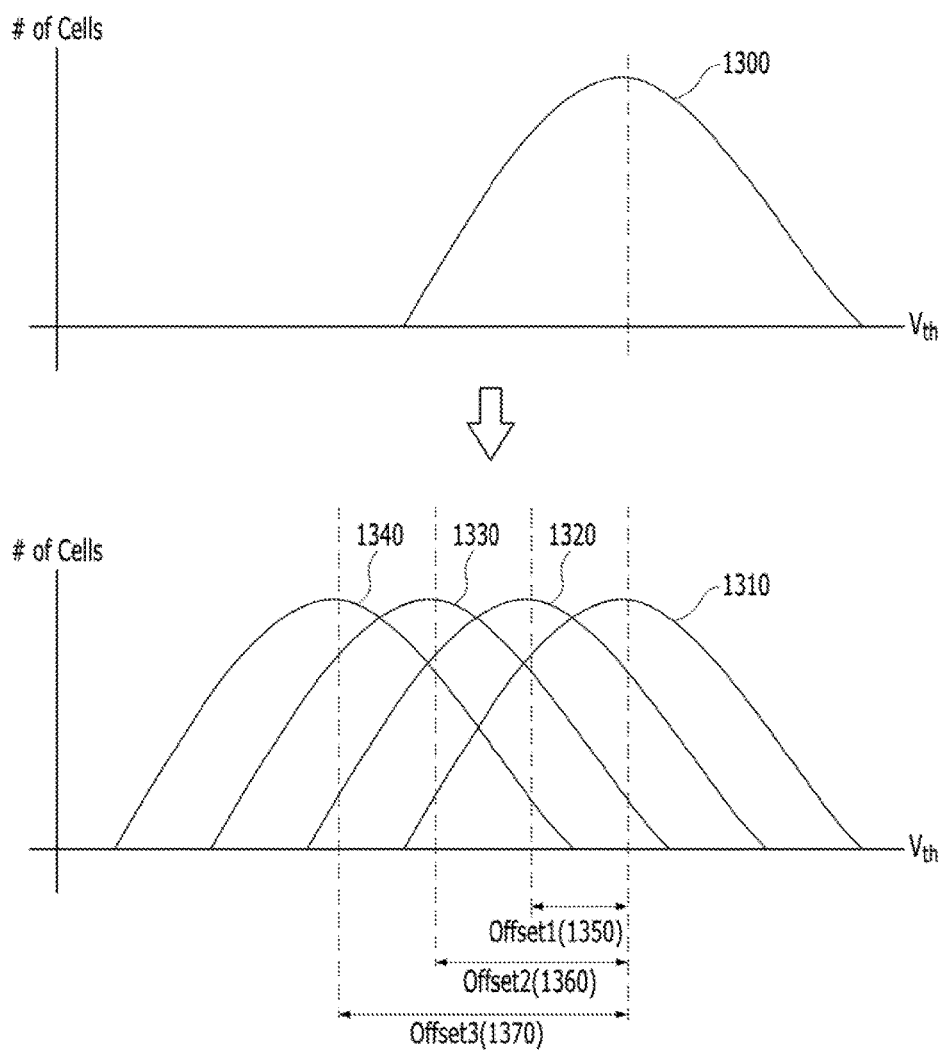

FIGS. 12 and 13 are diagrams schematically illustrating an operation method of the memory system 110 of FIG. 1.

In the present embodiment, when the memory system 110 is changed from the power-on state to the power-off state, the controller 130 may program test data to one or more pages of a memory block before the power-off of the memory system 110. When the memory system 110 is changed to the power-on state in a state where the memory system 110 maintains the power-off state during a long-term period, the controller 130 may read the test data programmed in the pages of the memory block, and then check a data offset of the test data. Furthermore, the controller 130 may check a parameter for the memory system 110 and a parameter offset according to the data offset, and adjust the parameter for the memory system 110 according to the parameter offset.

The controller 130 may check a time period, during which the memory system 110 maintains the power-off state, according to the data offset, and perform a copy operation to the data stored in the memory blocks and an erase operation to the memory blocks, according to the time period of the power-off.

According to an embodiment, examples of the parameter may include one or more of a parameter of a read operation (for example, a read voltage), an error correction parameter, a read reclaim parameter, and a read retry parameter.

According to another embodiment, other examples of the parameter may include one or more of a parameter (e.g., valid page count (VPC), erase count (EC), program/erase (P/E) cycle, and erase/write (E/W) cycle) for selecting source memory blocks and target memory blocks for the garbage collection (GC) or wear leveling (WL) operation.

Referring to FIG. 12, in response to a write command, the controller 130 may store data segments of user data corresponding to the write command in a first buffer 1210 serving as a data cache or data buffer included in the memory 144. Then, the controller 130 may program the data segments of user data stored in the first buffer 1210 to an arbitrary memory block among a plurality of memory blocks 0 to N−1, generate meta-segments of meta-data for the user data according to the program operation to the user data, and store the meta-data into second buffer 1220 serving as a meta cache or meta buffer included in the memory 144. Then, the controller 130 may program the meta-segments of meta-data stored in the second buffer 1220 to an arbitrary memory block among the plurality of memory blocks 0 to N−1.

The controller 130 may treat the parameter as the meta-data, and thus store the parameter in the second buffer 1220 and a memory block, (e.g., a memory Blocki (1265)) of the plurality of memory blocks Block0 to BlockN−1.

In response to a read command, the controller 130 may check meta-data in a memory block or the second buffer 1220 for user data, may read the user data from the corresponding memory block through the meta-data, and may provide the read user data to the host 102. At this time, the controller 130 may update the meta-segments in the second buffer 1220 for the read operation. Then, the controller 130 may program the meta-segments updated in the second buffer 1220 to an arbitrary memory block (e.g., the memory block i (1265)) among the plurality of memory blocks 0 to N−1.

In response to the erase command, the controller 130 may check meta-data in a memory block or the second buffer 1220 for the erase operation, may perform the erase operation to the corresponding memory block through the meta-data, thereby emptying the corresponding memory block into the open memory block. At this time, the controller 130 may update the meta-segments in the second buffer 1220 for the erase operation. Then, the controller 130 may program the meta-segments updated in the second buffer 1220 to an arbitrary memory block (e.g., the memory block i (1265)) among the plurality of memory blocks 0 to N−1.

The controller 130 may perform a command operation corresponding to a command in a state where the memory system 110 is powered on, and store a parameter of the command operation in an arbitrary memory block (e.g., the memory block i (1265)) among the memory blocks.

When the memory system 110 is changed from the power-on state to the power-off state at a first time point, the controller 130 may program test data of an arbitrary pattern to one or more pages of one (e.g., a zeroth page 'Page 0' of the memory block N−1 (1270)) among the memory blocks before the first time point. For reference, the power-off operation of the memory system 110 at the first time point is not SPO (Sudden Power Off). Therefore, the first time point is predictable.

That is, the controller 130 may generate the data segment of the test data, store the data segment in the first buffer 1210, and then program the data segment stored in the first buffer 1210 to the zeroth page 'Page 0' of the memory block N−1 before the first time point.

Also, the controller 130 may generate the meta-segment of the meta-data for the test data stored in the zeroth page 'Page 0' of the memory block N−1, store the meta-segment in the second buffer 1220, and program the meta-segment for the test data stored in the second buffer 1220 to pages of the memory block i (1265) before the first time point.

The meta-segment for the test data may include parameters of mapping information on the zeroth page 'Page 0' of the memory block N−1, in which the test data is programmed, in addition to one or more of the parameters of the test data and the zeroth page 'Page 0' of the memory block N−1. For example, the meta-segment for the test data may include parameters indicating the voltage distribution or current distribution of the test data and the number or locations of memory cells, in which the test data are programmed, among the plurality of memory cells included in the zeroth page 'Page 0' of the memory block N−1.

When the memory system 110 is changed to the power-on state from the power-off state at a second time point which is a long-term period after the first time point of the power-off of the memory system 110, the controller 130 may load the meta-segment for the test data from the memory block i (1265) to the second buffer 1220 and check the meta-segment. Then, the controller 130 may read the programmed test data of the zeroth page 'Page 0' of the memory block N−1 through map information of the programmed test data included in the meta-segment, and load the read test data to the first buffer 1210.

The controller 130 may check parameters (e.g., the voltage distribution or current distribution of the read test data and the number or locations of memory cells of the read test data) for the read test data of the second time point loaded in the first buffer 1210. Furthermore, the controller 130 may check parameters (e.g., the voltage distribution or current distribution of the programmed test data and the number or locations of memory cells of the programmed test data) for the programmed test data of the first time point through the meta-segment for the programmed test data loaded in the second buffer 1220.

The controller 130 may check a data offset of the test data through the parameters for the read test data and the programmed test data. Through the data offset of the test data, the controller 130 may check the time period of the power-off of the memory system 110 between the first and second time points. During the time period of the power-off of the memory system 110, there may also occur a parameter offset of the memory system 110, which may be represented by the data offset of the test data, and thus the parameter of the memory system 110 needs to be adjusted as much as the data offset of the test data. To this end, the controller 130 may check a parameter and a parameter offset of the memory system 110 according to the data offset of the test data, and adjust the parameter of the memory system 110 according to the parameter offset. The controller 130 may perform various operations (e.g., the copy, erase, read, garbage collection, and wear leveling operations) to the memory device 150 according to the adjusted parameter of the memory system 110.

Hereafter, a difference of the voltage distribution of the programmed test data of the first time period and the read test data of the second time period will be described with reference to FIG. 13. FIG. 13 provides intuition of the parameter offset of the memory system 110 represented by the data offset of the test data occurring during the time period of the power-off of the memory system 110 between the first and second time points.

Referring to FIG. 13, when the controller 130 programs the test data into the zeroth page 'Page 0' of the memory block N−1 before the first time point that the memory system 110 is changed from the power-on state to the power-off state, memory cells of the programmed test data at the first time point may have first or second voltage distribution 1300 or 1310.

At the second time point when the memory system 110 is changed to the power-off state from the power-on state, the memory cells storing the programmed test data in the zeroth page 'Page 0' of the memory block N−1 may have third to fifth voltage distributions 1320 to 1340, which are different from the second voltage distribution 1310, with the elapse of the time due to the characteristics of the memory cells of the memory device 150. That is, the first or second voltage distribution 1300 or 1310 representing the programmed test data of the first time point may be changed to the third to fifth voltage distributions 1320 to 1340 during the time period of the power-off of the memory system 110 between the first and second time points due to the characteristics of the memory cells of the memory device 150. Thus, a voltage distribution difference may occur from the second voltage distribution 1310 representing the programmed test data of the first time point to one of the third to fifth voltage distributions 1320 to 1340 representing the read test data of the second time point. That is, the data offset of the test data may occur, which implies the parameter offset of the memory system 110.

FIG. 13 exemplarily shows three data offsets (i.e., Offset1 (1350), Offset2 (1360) and Offset3 (1370)) of the test data respectively corresponding to the third to fifth voltage distributions 1320 to 1340 representing the read test data. Hereafter, for convenience of description, the data offset of the test data corresponding to the fifth voltage distribution 1340 of the read test data at the second time point will be taken as an example for description.

For example, the controller 130 may check the parameter (i.e., the second voltage distribution 1310 and the number or locations of memory cells of the programmed test data) for the programmed test data, which is stored in the zeroth page 'Page 0' of the memory block N−1 before the first time point, through the meta-data for the programmed test data, which is loaded in the second buffer 1220 from the memory block i (1265).

The controller 130 may check the parameter offset of the test data through difference between the parameter for the programmed test data of the first time point and the parameter for the read test data of the second time point. That is, the controller 130 may check the parameter offset of the test data through difference of the number or locations of memory cells between the second voltage distribution 1310 and the fifth voltage distribution 1340.

Accordingly, the controller 130 may take the offset 3 (1370) between the second voltage distribution 1310 and the fifth voltage distribution 1340 as the data offset of the test data.

The controller 130 may check the parameter and a parameter offset of the memory system 110 according to the data offset, and adjust the parameter for the memory system 110 according to the parameter offset. In other words, the controller 130 may check the time period of the power-off of the memory system 110 between the first and second time points according to the data offset of the test data, and perform various operations (e.g., the copy, erase, read, garbage collection, and wear leveling operations) to the memory device 150 according to the adjusted parameter of the memory system 110.

Figure 14:
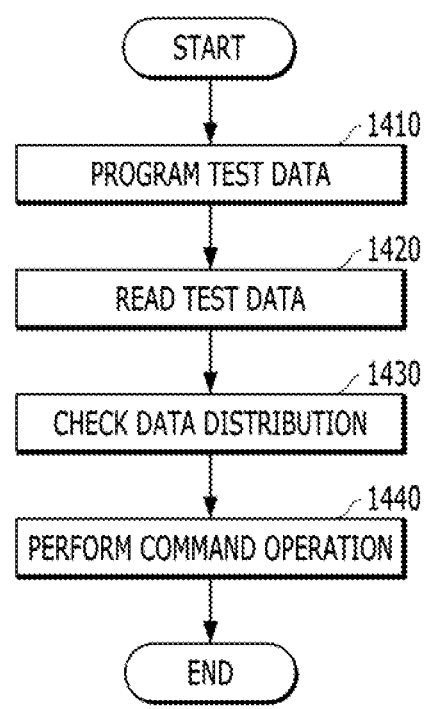
FIG. 14 is a flowchart of a data processing operation of the memory system according to an embodiment of the present invention.

FIG. 14 is a flowchart illustrating a data processing operation of the memory system 110, according to an embodiment of the present invention.

Referring to FIG. 14, when the memory system 110 is about to be changed from the power-on state to the power-off state at a first time point, the memory system 110 may program the test data of an arbitrary pattern to one or more pages of one memory block (e.g., a zeroth page 'Page 0' of the memory block N−1 (1270)) among a plurality of memory blocks 0 to N−1 before the first time point at step 1410. Furthermore, meta-data for the programmed test data or meta-data for the memory block of the programmed test data may be programmed to another memory block (e.g., the memory blocki (1265)) among the plurality of memory blocks Block0 to BlockN−1.

At step 1420, when the memory system 110 is changed to the power-on state from the power-off state at a second time point a long-term period after the first time point of the power-off of the memory system 110, the memory system 110 may read the meta-data programmed in the memory block i (1265), check map information on the programmed test data, and read the programmed test data from the zeroth page 'Page 0' of the memory block N−1 (1270) through the map information on the programmed test data.

At step 1430, the memory system 110 may check parameters (i.e., the voltage distribution or current distribution of the read test data and the number or locations of memory cells of the read test data) for the read test data of the second time point. Furthermore, the controller 130 may check parameters (i.e., the voltage distribution or current distribution of the programmed test data and the number or locations of memory cells of the programmed test data) for the programmed test data of the first time point through the meta-data for the programmed test data of step 1410.

At step 1440, the memory system 110 may check the data offset of the test data through a difference between the parameter for the programmed test data of the first time point and the parameter for the read test data of the second time point. Further, the memory system 110 may check the parameter and the parameter offset of the memory system 110 according to the data offset, adjust the parameter for the memory system 110 according to the parameter offset, and perform various operations (e.g., the copy, erase, read, garbage collection, and wear leveling operations) to the memory device 150 according to the adjusted parameter of the memory system 110.

Since the operation of programming the test data before the power-off of the memory system 110, the operation of reading the programmed test data after the time period of the power-off of the memory system 110 between the first and second time points, the operation of checking the data offset of the test data through the parameter offset of the test data, and the operation of checking the parameter and the parameter offset of the memory system 110 according to the data offset of the test data, the operation of adjusting the parameter of the memory system 110 according to the parameter offset of the memory system 110, and the command operation of the memory system 110 using the adjusted parameter have been described in detail with reference to FIGS. 12 and 13, the detailed descriptions are omitted herein.

In accordance with the embodiments of the present invention, the memory system and the operating method thereof is less complex, may reduce performance deterioration and may improve the use efficiency of a memory device included in the memory system, thereby more stably processing data to and from the memory device.

Although various embodiments have been described for illustrative purposes, it will be apparent to those skilled in the art that various changes and modifications may be made without departing from the spirit and/or scope of the invention as defined in the following claims.

What is claimed is:

1. A memory system comprising:
a memory device suitable for storing data; and
a controller suitable for programming test data to a first memory block of the memory device and programming meta-data corresponding to the programming of the test data to a second memory block of the memory device before a first time point when the memory system is changed from a power-on state to a power-off state at the first time point,
wherein when the memory system is changed to the power-on state at a second time point in a state where the memory system maintains the power-off state during a time period after the first time point, the controller reads the meta-data programmed in the second memory block at the second time point, and loads the read meta-data to a second buffer of the controller,
wherein the controller checks a first data distribution of the test data programmed before the first time point through the meta-data loaded in the second buffer, checks a second data distribution of the test data read out at the second time point through the read test data loaded in the first buffer,
wherein the controller checks a data offset of the test data through a difference between the first data distribution and the second data distribution, adjusts a parameter of the memory system by as much as the data offset of the test data, and performs a command operation to the memory system using the adjusted parameter, and
wherein the parameter includes a number or locations of memory cells.

2. The memory system of claim 1, wherein the controller generates the test data with a predetermined pattern, stores the generated test data in a first buffer, and programs the test data stored in the first buffer to the first memory block before the first time point, and
wherein the controller generates the meta-data according to the program of the test data, stores the generated meta-data in the second buffer, and programs the meta-data stored in the second buffer to the second memory block before the first time point.

3. The memory system of claim 2, wherein the controller checks map data of the test data through the meta-data loaded in the second buffer, reads the test data programmed in the first memory block through the map data, and loads the read test data to the first buffer.

4. The memory system of claim 1, wherein the controller checks a voltage distribution of memory cells storing the test data programmed before the first time point and a voltage distribution of the memory cells storing the test data read out at the second time point as the first data distribution and the second data distribution of the test data, respectively.

5. The memory system of claim 1, wherein the controller checks a number of memory cells or locations of memory cells storing the test data programmed before the first time point and the number or locations of the memory cells storing the test data read out at the second time point as the first data distribution and the second data distribution, respectively.

6. The memory system of claim 1, wherein the controller programs the test data to all pages included in the first memory block or a first page among all the pages.

7. The memory system of claim 6, wherein the meta-data comprises a number of memory cells or locations of memory cells in which the test data are programmed, among a plurality of memory cells included in all the pages or the first page.

8. An operating method of a memory system including a memory device, comprising:
   confirming that the memory device is changed to a power-off state from a power-on state at a first time point;
   programming test data to a first memory block of the memory device before the first time point;
   programming meta-data corresponding to the programming of the test data to a second memory block of the memory device before the first time point,
   confirming that the memory system is changed to the power-on state at a second time point, in a state where the memory system maintains the power-off state during a time period after the first time point;
   reading the meta data programmed in the second memory block at the second time point, and loading the read meta data to a second buffer;
   checking a first data distribution of the test data programmed before the first time point through the meta-data loaded in the second buffer;
   checking a second data distribution of the test data read out at the second time point through the read test data loaded in the first buffer;
   checking a data offset of the test data through difference between the first data distribution and the second data distribution;
   adjusting a parameter of the memory system by as much as the data offset of the test data, wherein the parameter of the memory system includes a number or locations of memory cells; and
   performing a command operation to the memory system using the adjusted parameter.

9. The operating method of claim 8,
   wherein the programming of the test data to the first memory block before the first time point comprises:
   generating the test data with a predetermined pattern and storing the generated test data in a first buffer; and
   programming the test data stored in the first buffer to the first memory block, and
   wherein the programming of the meta-data to the second memory block before the first time point comprises:
   generating the meta-data and storing the generated meta-data in the second buffer; and
   programming the meta-data stored in the second buffer to the second memory block.

10. The operating method of claim 9, further comprising:
    checking map data of the test data through the meta-data loaded in the second buffer; and
    reading the test data programmed in the first memory block through the map data, and loading the read test data to the first buffer.

11. The operating method of claim 8, wherein the checking of the first data distribution and the second data distribution comprises checking a voltage distribution of memory cells storing the test data programmed before the first time point and a voltage distribution of the memory cells storing the test data read out at the second time point as the first data distribution and the second data distribution of the test data, respectively.

12. The operating method of claim 8, wherein the checking of the first data distribution and the second data distribution comprises checking a number of memory cells or locations of memory cells storing the test data programmed before the first time point and the number or locations of the memory cells storing the test data read out at the second time point as the first data distribution and the second data distribution, respectively.

13. The operating method of claim 8, wherein the programming of the test data to the first memory block comprises programming the test data to all pages included in the first memory block or a first page among all the pages.

14. The operating method of claim 13, wherein the meta-data comprises a number of memory cells or locations of memory cells in which the test data are programmed, among a plurality of memory cells included in all the pages or the first page.

* * * * *